(12) United States Patent
Kwon et al.

(10) Patent No.: US 9,595,610 B2
(45) Date of Patent: Mar. 14, 2017

(54) FIELD EFFECT TRANSISTOR AND METHOD OF FABRICATING THE SAME

(71) Applicant: Samsung Electronics Co., Ltd., Suwon-si (KR)

(72) Inventors: TaeYong Kwon, Suwon-si (KR); Shigenobu Maeda, Seongnam-si (KR); David Seo, Yongin-si (KR); Jae-Hwan Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/723,673

(22) Filed: May 28, 2015

(65) Prior Publication Data
US 2016/0005864 A1    Jan. 7, 2016

(30) Foreign Application Priority Data

Jul. 7, 2014  (KR) .......................... 10-2014-0084656

(51) Int. Cl.
*H01L 29/78* (2006.01)
*H01L 29/165* (2006.01)
*H01L 29/08* (2006.01)
*H01L 29/66* (2006.01)

(52) U.S. Cl.
CPC ...... *H01L 29/7849* (2013.01); *H01L 29/0843* (2013.01); *H01L 29/0847* (2013.01); *H01L 29/0869* (2013.01); *H01L 29/0878* (2013.01); *H01L 29/0886* (2013.01); *H01L 29/165* (2013.01); *H01L 29/66636* (2013.01); *H01L 29/785* (2013.01); *H01L 29/7842* (2013.01); *H01L 29/7848* (2013.01)

(58) Field of Classification Search
None
See application file for complete search history.

(56) References Cited

U.S. PATENT DOCUMENTS

| | | |
|---|---|---|
| 6,855,963 B1 | 2/2005 | Chu et al. |
| 6,900,502 B2 | 5/2005 | Ge et al. |
| 7,566,605 B2 | 7/2009 | Shifren et al. |
| 7,943,969 B2 | 5/2011 | Yang et al. |
| 8,124,473 B2 | 2/2012 | Pan et al. |

(Continued)

FOREIGN PATENT DOCUMENTS

| | | |
|---|---|---|
| JP | 2002043576 | 2/2002 |
| JP | 5431372 | 3/2014 |

(Continued)

*Primary Examiner* — Fei Fei Yeung Lopez
(74) *Attorney, Agent, or Firm* — Onello & Mello LLP

(57) ABSTRACT

A MOSFET may be formed with a strain-inducing mismatch of lattice constants that improves carrier mobility. In exemplary embodiments a MOSFET includes a strain-inducing lattice constant mismatch that is not undermined by a recessing step. In some embodiments a source/drain pattern is grown without a recessing step, thereby avoiding problems associated with a recessing step. Alternatively, a recessing process may be performed in a way that does not expose top surfaces of a strain-relaxed buffer layer. A MOSFET device layer, such as a strain-relaxed buffer layer or a device isolation layer, is unaffected by a recessing step and, as a result, strain may be applied to a channel region without jeopardizing subsequent formation steps.

11 Claims, 15 Drawing Sheets

(56) References Cited

U.S. PATENT DOCUMENTS

| | | |
|---|---|---|
| 8,253,204 B2 | 8/2012 | Lee et al. |
| 8,288,825 B2 | 10/2012 | Chong et al. |
| 8,766,236 B2 | 7/2014 | Usuda et al. |
| 2002/0008289 A1 | 1/2002 | Murota et al. |
| 2005/0205859 A1* | 9/2005 | Currie ............... H01L 21/76224 257/19 |
| 2005/0224800 A1* | 10/2005 | Lindert ............. H01L 29/66795 257/66 |
| 2006/0011984 A1* | 1/2006 | Currie ............... H01L 21/76254 257/352 |
| 2007/0221956 A1* | 9/2007 | Inaba ................ H01L 21/82380 257/197 |
| 2009/0108308 A1 | 4/2009 | Yang et al. |
| 2010/0109097 A1* | 5/2010 | Zhang ................ H01L 29/0847 257/408 |
| 2011/0212604 A1 | 9/2011 | Yang et al. |
| 2012/0091528 A1* | 4/2012 | Chang ................ H01L 29/7848 257/347 |
| 2012/0153387 A1 | 6/2012 | Murthy et al. |
| 2012/0161105 A1 | 6/2012 | Rachmady et al. |
| 2012/0168830 A1 | 7/2012 | Usuda et al. |
| 2013/0093026 A1* | 4/2013 | Wann ................ H01L 21/82382 257/401 |
| 2014/0008730 A1* | 1/2014 | Mitard ................ H01L 27/092 257/369 |

FOREIGN PATENT DOCUMENTS

| | | |
|---|---|---|
| KR | 2010078341 | 7/2010 |
| KR | 101369907 | 3/2014 |

\* cited by examiner

FIELD EFFECT TRANSISTOR AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0084656, filed on Jul. 7, 2014, in the Korean Intellectual Property Office, the entire contents of which are hereby incorporated by reference.

BACKGROUND OF THE INVENTION

Exemplary embodiments in accordance with principles of inventive concepts relate to a field effect transistor, and in particular, to a field effect transistor having a channel region to which strain is applied, and a method of fabricating the same.

A semiconductor device typically includes an integrated circuit of metal-oxide-semiconductor field effect transistors (MOSFETs). As device feature sizes diminish in order to continuously increase the capabilities of semiconductor devices, various obstacles to successful implementation, such as the short channel effect, for example, may be encountered. A method and apparatus for increasing MOSFET carrier mobility may provide the myriad benefits of increased device density/decreased feature size, lower power consumption, and improved device reliability.

One approach to increasing carrier mobility involves establishing a strain, through lattice constant mismatch, on a MOSFET's channel region. Source/Drain patterns may be formed with recessed portions of a substrate. The recessed portions of the substrate may then be filled with materials having a lattice constant different from that of the substrate, resulting in a strain on the channel region and increased carrier mobility. However, during a recessing step a device isolation layer may be exposed, resulting in difficulty growing material for the Source/Drain regions. In another approach, strain-relaxed buffer layers may be employed to exert a strain on a channel region, the process also employing a recessing step. However, with such an approach, the recessing step may relax the strain imposed on the channel region and, because the strain relaxed buffer layers may be exposed, subsequent formation of semiconductor material may be compromised.

SUMMARY

Exemplary embodiments in accordance with principles of inventive concepts include a field effect transistor with an increased integration density and improved electric characteristics.

Other exemplary embodiments in accordance with principles of inventive concepts provide a method of fabricating a field effect transistor with an increased integration density and improved electric characteristics.

Exemplary embodiments in accordance with principles of inventive concepts include afield effect transistor including a semiconductor substrate, an active pattern protruding from the semiconductor substrate, a buffer pattern interposed between the active pattern and the semiconductor substrate, a gate electrode crossing and partially covering top and side surfaces of the active pattern, a gate insulating layer interposed between the gate electrode and the active pattern, source and drain regions formed in portions of the active pattern at both sides of the gate electrode and doped with impurities, and source and drain patterns provided on the source and drain regions, respectively, each of the source and drain patterns including an epitaxial layer, wherein the active pattern has a lattice constant different from that of the buffer pattern.

Exemplary embodiments in accordance with principles of inventive concepts include a field effect transistor wherein the active pattern is of a p-type, the source and drain regions are of an n-type, and the buffer pattern has a lattice constant larger than that of the active pattern.

Exemplary embodiments in accordance with principles of inventive concepts include a field effect transistor wherein source and drain patterns have a lattice constant smaller than that of the active pattern.

Exemplary embodiments in accordance with principles of inventive concepts include a field effect transistor wherein the active pattern is of an n-type, the source and drain regions are of a p-type, the buffer pattern has a lattice constant smaller than that of the active pattern.

Exemplary embodiments in accordance with principles of inventive concepts include a field effect transistor wherein the source and drain patterns have a lattice constant larger than that of the active pattern.

Exemplary embodiments in accordance with principles of inventive concepts include a field effect transistor wherein the source and drain patterns have bottom surfaces positioned at a higher level than a lowermost surface of the gate electrode.

Exemplary embodiments in accordance with principles of inventive concepts include a field effect transistor including a semiconductor substrate, an active pattern protruding from the semiconductor substrate, a buffer pattern interposed between the active pattern and the semiconductor substrate, a gate electrode crossing and partially covering top and side surfaces of the active pattern, a gate insulating layer interposed between the gate electrode and the active pattern, and source and drain patterns spaced apart from the buffer pattern, each of the source and drain patterns comprising an epitaxial layer and an insertion portion inserted into the active pattern at a corresponding one of both sides of the gate electrode, wherein the active pattern has a lattice constant different from that of the buffer pattern, and the source and drain patterns have a lattice constant different from that of the active pattern.

Exemplary embodiments in accordance with principles of inventive concepts include a field effect transistor wherein the source and drain patterns have top surfaces positioned at a higher level than a top surface of the active pattern.

Exemplary embodiments in accordance with principles of inventive concepts include a field effect transistor wherein the active pattern is of a p-type, the source and drain patterns are of an n-type, and the buffer pattern has a lattice constant larger than that of the active pattern.

Exemplary embodiments in accordance with principles of inventive concepts include a field effect transistor wherein the source and drain patterns have a lattice constant smaller than that of the active pattern.

Exemplary embodiments in accordance with principles of inventive concepts include a field effect transistor wherein the active pattern is of an n-type, the source and drain patterns are of a p-type, and the buffer pattern has a lattice constant smaller than that of the active pattern.

Exemplary embodiments in accordance with principles of inventive concepts include a field effect transistor wherein the source and drain patterns have a lattice constant larger than that of the active pattern.

Exemplary embodiments in accordance with principles of inventive concepts include a field effect transistor wherein the insertion portion of the source and drain patterns has a thickness ranging from about ⅓ to ⅔ times a thickness of the active pattern.

Exemplary embodiments in accordance with principles of inventive concepts include a field effect transistor wherein the source and drain patterns have bottom surfaces positioned at a higher level than a lowermost surface of the gate electrode.

Exemplary embodiments in accordance with principles of inventive concepts include a field effect transistor wherein including a semiconductor substrate, an active pattern protruding from the semiconductor substrate, a buffer pattern interposed between the active pattern and the semiconductor substrate, the active pattern and buffer layer having a strain-inducing mismatch in lattice constants, a gate electrode crossing and partially covering top and side surfaces of the active pattern, a gate insulating layer interposed between the gate electrode and the active pattern, source and drain regions formed in portions of the active pattern at both sides of the gate electrode and doped with impurities; and source and drain patterns provided on the source and drain regions, respectively, each of the source and drain patterns including an epitaxial layer, wherein bottom surfaces of the source and drain patterns are above a top surface of the buffer layer.

Exemplary embodiments in accordance with principles of inventive concepts include a field effect transistor wherein the active pattern is not recessed.

Exemplary embodiments in accordance with principles of inventive concepts include a field effect transistor wherein the active pattern is recessed less than ⅔ of its thickness.

Exemplary embodiments in accordance with principles of inventive concepts include a field effect transistor wherein the strain is a compressive strain.

Exemplary embodiments in accordance with principles of inventive concepts include a field effect transistor wherein the strain is a tensile strain.

Exemplary embodiments in accordance with principles of inventive concepts include an electronic device including a field effect transistor field effect transistor including a semiconductor substrate, an active pattern protruding from the semiconductor substrate, a buffer pattern interposed between the active pattern and the semiconductor substrate, the active pattern and buffer layer having a strain-inducing mismatch in lattice constants, a gate electrode crossing and partially covering top and side surfaces of the active pattern, a gate insulating layer interposed between the gate electrode and the active pattern, source and drain regions formed in portions of the active pattern at both sides of the gate electrode and doped with impurities; and source and drain patterns provided on the source and drain regions, respectively, each of the source and drain patterns including an epitaxial layer, wherein bottom surfaces of the source and drain patterns are above a top surface of the buffer layer.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

Figure 1:
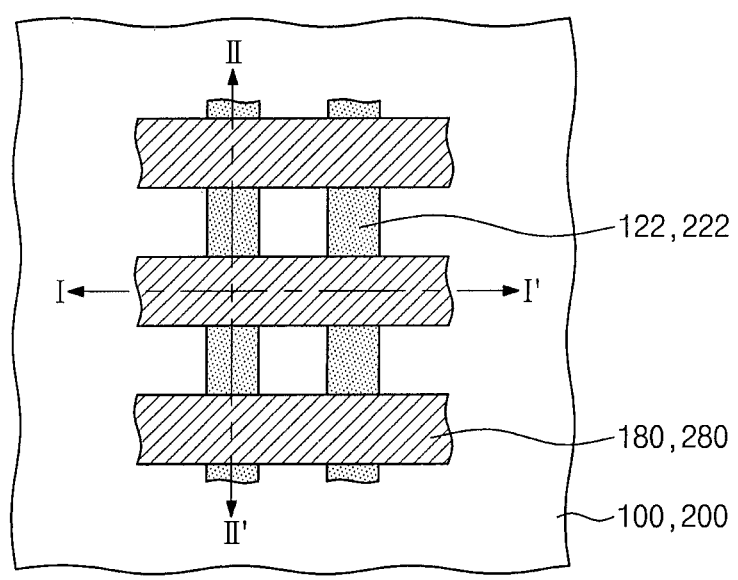
FIG. 1 is a plan view illustrating an exemplary embodiment of a field effect transistor in accordance with principles of inventive concepts.

It should be noted that these figures are intended to illustrate the general characteristics of methods, structure and/or materials utilized in certain exemplary embodiments and to supplement the written description provided below. These drawings are not, however, to scale and may not precisely reflect the structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various exemplary embodiments will be described more fully hereinafter with reference to the accompanying drawings, in which some exemplary embodiments are shown. Inventive concepts may, however, be embodied in many different forms and should not be construed as limited to the exemplary embodiments set forth herein. Rather, these exemplary embodiments are provided so that this description will be thorough and complete, and will convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items and the term "or" is meant to be inclusive, unless otherwise indicated.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts. The thickness of layers may be exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein Devices and methods of forming devices according to various embodiments described herein may be embodied in microelectronic devices such as integrated circuits, wherein a plurality of devices according to various exemplary embodiments described herein are integrated in the same microelectronic device. Accordingly, the cross-sectional view(s) illustrated herein may be replicated, for example, in two different directions, which need not be orthogonal, in the microelectronic device. A plan view of the microelectronic device that embodies devices according to various exemplary embodiments described herein may include a plurality of the devices in an array and/or in a two-dimensional pattern that is based on the functionality of the microelectronic device.

Devices in accordance with principles of inventive concepts as illustrated in exemplary embodiments described herein may be interspersed among other devices depending on the functionality of the microelectronic device. Moreover, microelectronic devices in accordance with principles of inventive concepts described herein may be replicated in a third direction that may be orthogonal to the two different directions, to provide three-dimensional integrated circuits.

Accordingly, the cross-sectional view(s) illustrated herein provide support for a plurality of devices in accordance with principles of inventive concepts described herein in relation to exemplary embodiments that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

In accordance with principles of inventive concepts, a MOSFET may be formed with a strain-inducing mismatch of lattice constants that improves carrier mobility. In exemplary embodiments a MOSFET includes a strain-inducing lattice constant mismatch that is not undermined by a recessing step. In some exemplary embodiments in accordance with principles of inventive concepts, a source/drain pattern is grown without a recessing step, thereby circumventing the deleterious effects of a recessing step. In other exemplary embodiments in accordance with principles of inventive concepts, a recessing process may be performed in a way that does not expose top surfaces of a strain-relaxed buffer layer. By avoiding exposure, due to a recessing step, of a device layer (for example, strain-relaxed buffer layer or a device isolation layer), a MOSFET, and method of forming the same, in accordance with principles of inventive concepts provide an electronic device with high mobility carriers in a reliable fashion.

Figure 2:
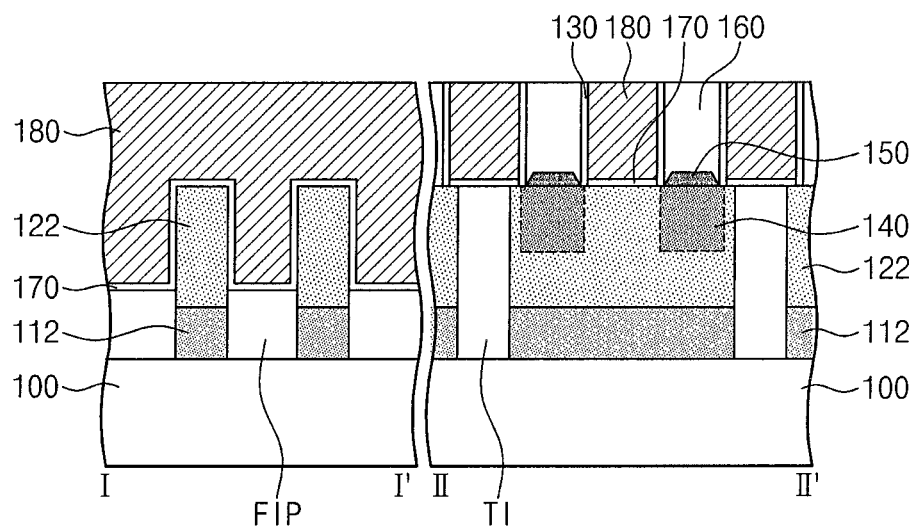
FIG. 2 is a sectional view illustrating a field effect transistor according to a first exemplary embodiment.

FIG. 1 is a plan view illustrating a field effect transistor according to exemplary embodiments in accordance with principles of inventive concepts. FIG. 2 is a sectional view illustrating a field effect transistor according to a first embodiment in accordance with principles of inventive concepts. For example, FIG. 2 shows sections taken along lines I-I' and II-II' of FIG. 1. Hereinafter, a field effect transistor according to the first exemplary embodiment in accordance with principles of inventive concepts will be described with reference to FIGS. 1 and 2.

Referring to FIGS. 1 and 2, a field effect transistor (FET) may include a semiconductor substrate 100, a buffer pattern 112, an active pattern 122, a gate spacer 130, source and drain regions 140, source and drain patterns 150, an interlayered insulating layer 160, a gate insulating layer 170, a gate electrode 180, a fin-isolating pattern FIP, and a device isolation pattern TI, for example.

In exemplary embodiments, the semiconductor substrate 100 may be a single crystalline silicon wafer. In other embodiments, the semiconductor substrate 100 may be a silicon-on-insulator (SOI) wafer, a germanium wafer, a germanium-on-insulator (GOI) wafer, a silicon-germanium wafer, or a substrate including an epitaxial layer. In still other embodiments, the semiconductor substrate 100 may include at least one of III-V compound semiconductors.

The active pattern 122 may protrude upward from a top surface of the semiconductor substrate 100, and the buffer pattern 112 may be interposed between the active pattern 122 and the semiconductor substrate 100. The buffer pattern 112 and the active pattern 122 may constitute a fin structure. The active pattern 122 may have a thickness ranging from about 40 nm to about 60 nm, for example.

The active pattern 122 may be doped with impurities. As an example, in the case of an NMOS FET, the active pattern 122 may contain p-type impurities. As another example, in the case of a PMOS FET, the active pattern 122 may contain n-type impurities.

In exemplary embodiments in accordance with principles of inventive concepts, buffer pattern 112 and the active pattern 122 may have the same lattice structure but different lattice constants and, as a result, the buffer pattern 112 may be in a strain-relaxed state, whereby a strain may be exerted on the active pattern 122. As an example, for an NMOS FET, the buffer pattern 112 may have a larger lattice constant than that of the active pattern 122, and in such embodiments, a tensile strain may be exerted on the active pattern 122. As another example, for a PMOS FET, the buffer pattern 112 may have a smaller lattice constant than that of the active pattern 122, and in such embodiments, a compressive strain may be exerted on the active pattern 122.

The fin-isolating pattern FIP may be provided between the fin structures to partially expose the active pattern 122. In exemplary embodiments in accordance with principles of inventive concepts, the fin-isolating pattern FIP may have a top surface that is higher than that of the buffer pattern 112 and lower than that of the active pattern 122.

The device isolation pattern TI may divide the fin structure into a plurality of device regions. In exemplary embodiments, the FETs may be formed on the device regions.

The gate electrode 180 may cross the active pattern 122 and cover top and side surfaces of the active pattern 122 exposed by the fin-isolating pattern FIP. The gate electrode 180 may include a barrier metal layer and a metal layer. For example, the barrier metal layer may be formed of a metal nitride layer (e.g., of titanium nitride, tantalum nitride, tungsten nitride, hafnium nitride, and zirconium nitride). The metal layer may be formed of at least one of tungsten, copper, hafnium, zirconium, titanium, tantalum, aluminum, ruthenium, palladium, platinum, cobalt, nickel, or conductive metal nitrides, for example.

The gate insulating layer 170 may be interposed between the active pattern 122 and the gate electrode 180. The gate insulating layer 170 may be formed of at least one of high-k dielectric materials (e.g., hafnium oxide, hafnium silicate, zirconium oxide, or zirconium silicate).

The gate spacer 130 may be provided on both sides of the gate electrode 180. The gate spacer 130 may include at least one of silicon oxide, silicon oxynitride, or silicon nitride, for example.

The source and drain regions 140 may be formed in portions of the active pattern 122, which are positioned at both sides of the gate electrode 180 in a plan view, and may be doped regions containing impurities. The formation of the source and drain regions 140 may include injecting impurities into the active pattern 122 using an ion implantation process, for example. As an example, for an NMOS FET, the source and drain regions 140 may contain n-type impurities and for a PMOS FET, the source and drain regions 140 may contain p-type impurities. In an exemplary embodiment in accordance with principles of inventive concepts, the formation of the source and drain regions 140 does not include a step of recessing the active pattern 122, and as a result, strain exerted on the active pattern 122 from the buffer pattern 112 can be preserved.

The source and drain patterns 150 may be formed on the source and drain regions 140 using an epitaxial growth process, for example. In exemplary embodiments, the epitaxial growth process may be performed in such a way that the source and drain patterns 150 are doped with impurities in an in-situ manner. For an NMOS FET, the source and drain patterns 150 may contain n-type impurities. For a PMOS FET, the source and drain patterns 150 may contain p-type impurities. In exemplary embodiments in accordance with principles of inventive concepts the source and drain patterns 150 may have the same lattice structure as, and a different lattice constant from, the active pattern 122. As an example, for an NMOS FET the source and drain patterns 150 may have a lattice constant smaller than that of the active pattern 122. For example, in exemplary embodiments in which the active pattern 122 is formed of silicon (Si), the source and drain patterns 150 may be formed of silicon carbide ($Si_{1-x}C_x$). In such embodiments a compressive strain may be exerted on the source and drain regions 140 from the source and drain patterns 150, and consequently, a tensile strain may be exerted on the active pattern 122 between the source and drain regions 140. In exemplary embodiments of a PMOS FET, the source and drain patterns 150 may have a lattice constant larger than that of the active pattern 122. For example, in embodiments in which the active pattern 122 is formed of silicon (Si), the source and drain patterns 150 may be formed of silicon germanium ($Si_{1-x}Ge_x$). In such embodiments, a tensile strain may be exerted on the source and drain regions 140 from the source and drain patterns 150, and as a result, a compressive strain may be exerted on the active pattern 122 between the source and drain regions 140. The gate electrode 180 may fill a gap region, which is positioned between the active patterns 122 and on the fin-isolating pattern FIP. Additionally, in exemplary embodiments, bottom surfaces of the source and drain patterns 150 may be positioned at a higher level than the lowermost surface of the gate electrode 180.

In exemplary embodiments in accordance with principles of inventive concepts, interlayered insulating layer 160 may be provided on the source and drain patterns 150 and may include at least one of a silicon oxide layer, a silicon nitride layer, a silicon oxynitride layer, or low-k dielectric layers, for example.

Figure 3:
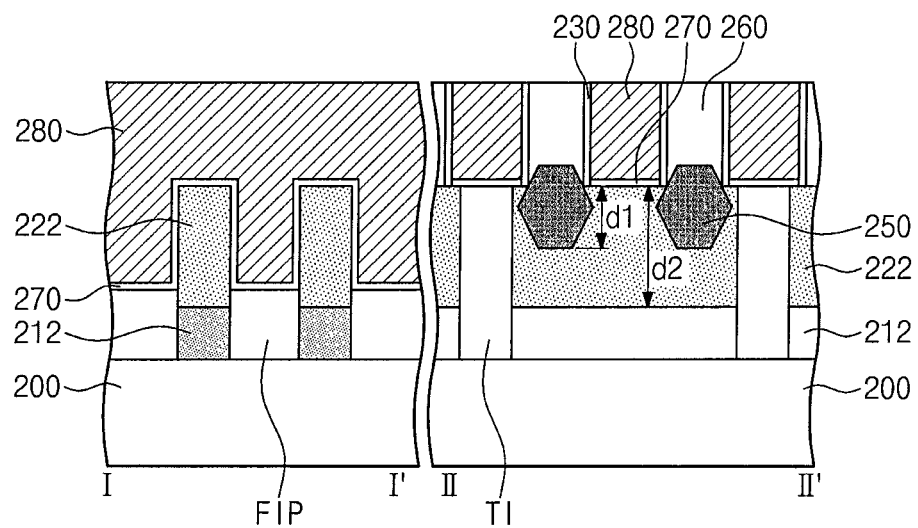
FIG. 3 is a sectional view illustrating a field effect transistor according to a second exemplary embodiment.

FIG. 3 is a sectional view illustrating a field effect transistor according to a second exemplary embodiment in accordance with principles of inventive concepts which shows sections taken along lines I-I' and II-II' of FIG. 1. Hereinafter, a field effect transistor according to a second exemplary embodiment in accordance with principles of inventive concepts will be described with reference to FIGS. 1 and 3.

Referring to FIGS. 1 and 3, a field effect transistor (FET) may include a semiconductor substrate 200, a buffer pattern 212, an active pattern 222, a gate spacer 230, source and drain patterns 250, an interlayered insulating layer 260, a gate insulating layer 270, a gate electrode 280, a fin-isolating pattern FIP, and a device isolation pattern TI. The semiconductor substrate 200, the buffer pattern 212, the active pattern 222, the gate spacer 230, the interlayered insulating layer 260, the gate insulating layer 270, the gate electrode 280, the fin-isolating pattern FIP, and the device isolation pattern TI may have the same features as the semiconductor substrate 100, the buffer pattern 112, the active pattern 122, the gate spacer 130, the interlayered insulating layer 160, the gate insulating layer 170, the gate electrode 180, the fin-isolating pattern FIP, and the device isolation pattern TI, respectively, of the FET described with reference to FIGS. 1 and 2 and, as a result, a detailed description thereof will not be repeated here.

The source and drain patterns 250 may be provided at both sides of the gate electrode 280. For example, the source and drain patterns 250 may be inserted into the active pattern 222 and may be vertically spaced apart from the buffer pattern 212. The formation of the source and drain patterns 250 may include recessing portions of the active pattern 222 at both sides of the gate electrode 280 and then growing semiconductor patterns from the recessed portions using, for example, an epitaxial growth process. In exemplary embodiments, the epitaxial growth process may be performed in such a way that the source and drain patterns 250 are doped with impurities in an in-situ manner. As an example, for an NMOS FET, the source and drain patterns 250 may contain n-type impurities and, for a PMOS FET, the source and drain patterns 250 may contain p-type impurities. The source and drain patterns 250 may have top surfaces that are higher than that of the active pattern 222. In exemplary embodiments, the source and drain patterns 250 may be formed in such a way that a thickness of a portion inserted into the active pattern 222 (hereinafter, a recess depth d1) ranges from about ⅓ to ⅔ times a thickness d2 of the active pattern 222. In other exemplary embodiments, the recess depth d1 may be about half the thickness d2 of the active pattern 222. For example, the recess depth d1 may range from 20 nm to 30 nm. Were the active pattern 222 recessed to form the source and drain patterns 250, a strain exerted on the active pattern 222 could be relaxed; however, in exemplary embodiments in accordance with principles of inventive concepts, as in the case of the FET described with reference to FIG. 3, the active pattern 222 may have a limitation on the recess depth d1, and this makes it possible to suppress the relaxation of the strain. Due to the limitation on the recess depth d1 of the active pattern 222, bottom surfaces of the source and drain patterns 250 may be located at a higher level than the lowermost surface of the gate electrode 280. However, exemplary embodiments in accordance with principles of inventive concepts are not limited thereto. For example, in certain embodiments, the source and drain patterns 250 may be formed in such a way that the bottom surfaces thereof are positioned at the same level as, or a lower level than, the lowermost surface of the gate electrode 280.

The source and drain patterns 250 may have the same lattice structure as, and a lattice constant different from, the active pattern 222. As an example, for an NMOS FET, the source and drain patterns 250 may have a smaller lattice constant than that of the active pattern 222. In such embodiments a tensile strain may be exerted on the active pattern 222 between the source and drain patterns 250. As another example, for a PMOS FET, the source and drain patterns 250 may have a lattice constant larger than that of the active pattern 222. In such embodiments a compressive strain may be exerted on the active pattern 222 between the source and drain patterns 250.

Figure 4:
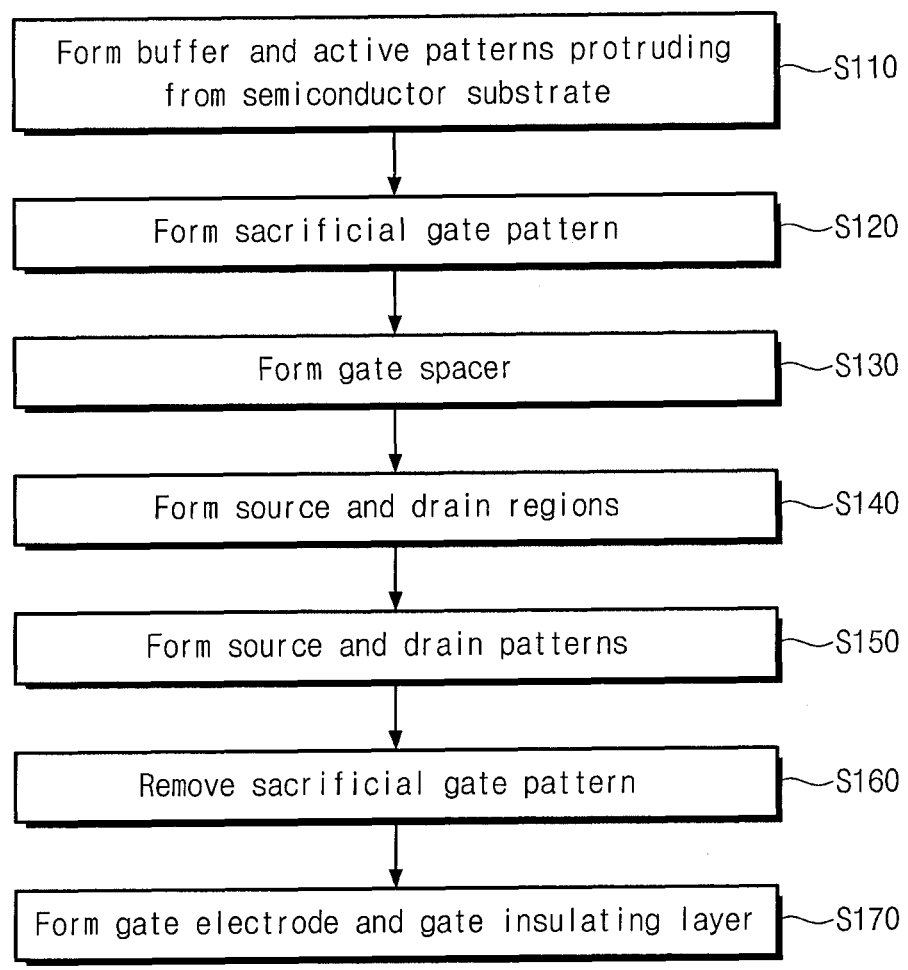
FIG. 4 is a flow chart illustrating a method of fabricating a field effect transistor according to a first exemplary embodiment in accordance with principles of inventive concepts.

FIG. 4 is a flow chart illustrating a method of fabricating a field effect transistor according to a first exemplary embodiment in accordance with principles of inventive concepts. FIGS. 5 through 17 are sectional views illustrating a method of fabricating a field effect transistor according to a first exemplary embodiment in accordance with principles of inventive concepts. Each of FIGS. 5 through 17 shows sections taken along lines I-I' and II-II' of FIG. 1. Hereinafter, an exemplary method of fabricating a field effect transistor according to the first embodiment of inventive concepts will be described with reference to FIGS. 1 and 4 through 17. For concise description, previously described elements may be identified by a similar or identical reference number and a detailed description will not be repeated here.

Referring to FIG. 4, a method of fabricating a field effect transistor in accordance with principles of inventive concepts may include forming buffer and active patterns protruding from a semiconductor substrate (in S110), forming a sacrificial gate pattern (in S120), forming a gate spacer (in S130), forming source and drain regions (in S140), forming source and drain patterns (in S150), removing the sacrificial gate pattern (in S160), and forming a gate electrode and a gate insulating layer (in S170).

As shown in FIGS. 1 and 4 through 6, the buffer pattern 112 and the active pattern 122 may be formed on the semiconductor substrate 100 (in S110). In exemplary embodiments in accordance with principles of inventive concepts, the buffer pattern 112 and the active pattern 122 may protrude from the semiconductor substrate 100.

Figure 5:
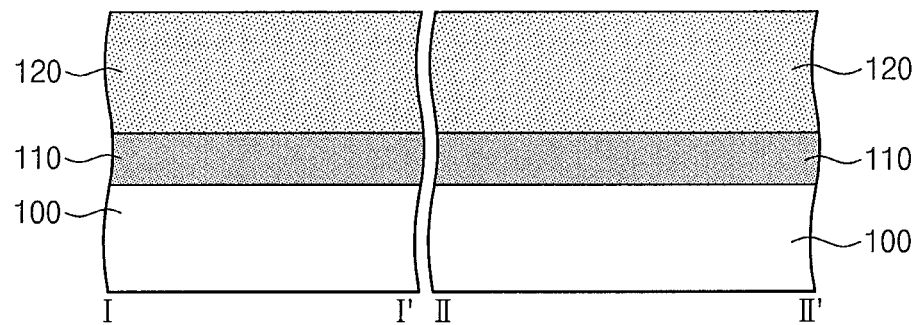
FIGS. 5 through 17 are sectional views illustrating a method of fabricating a field effect transistor according to a first exemplary embodiment in accordance with principles of inventive concepts.

Referring to FIG. 5, a buffer layer 110 and an active layer 120 may be sequentially formed on semiconductor substrate 100 using an epitaxial growth process, for example. In exemplary embodiments in accordance with principles of inventive concepts, buffer layer 110 and active layer 120 may have the same lattice structure, but different lattice constants. As a result, the buffer layer 110 may be in a strain-relaxed state, whereby a strain may be exerted on the active layer 120. As an example, for a NMOS field effect transistor, the buffer layer 110 may have a lattice constant larger than that of the active layer 120, and in such exemplary embodiments, a tensile strain may be exerted on the active layer 120. As another example, for a PMOS field effect transistor, the buffer layer 110 may have a lattice constant smaller than that of the active layer 120, and in such exemplary embodiments, a compressive strain may be exerted on the active layer 120.

The buffer layer 110 and the active layer 120 may be formed by performing an epitaxial growth process on the semiconductor substrate 100. In exemplary embodiments, the epitaxial growth process may be performed using a chemical vapor deposition (CVD) or molecular beam epitaxy (MBE) process, for example.

Figure 6:
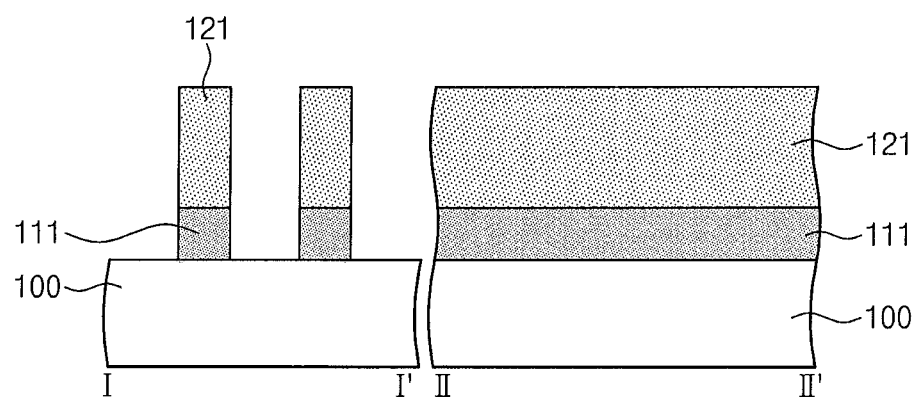

Referring to FIG. 6, the buffer layer 110 and the active layer 120 may be patterned to form a preliminary buffer pattern 111 and a preliminary active pattern 121, which protrude from the semiconductor substrate 100. The preliminary buffer pattern 111 and the preliminary active pattern 121 may constitute a preliminary fin structure.

Figure 7:
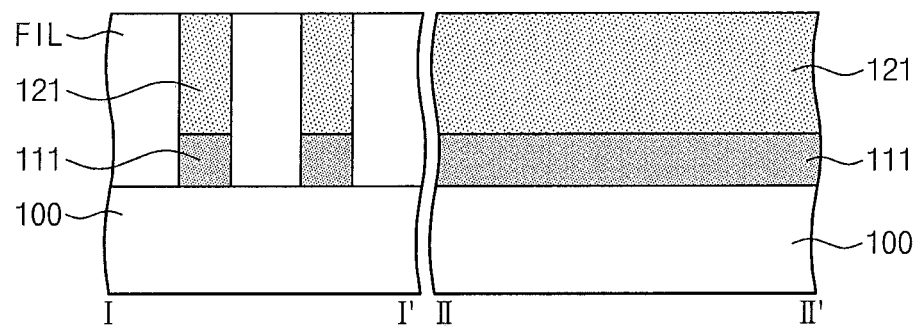

Referring to FIG. 7, a fin-isolating layer FIL may be formed between the preliminary fin structures. The formation of the fin-isolating layer FIL may include depositing an insulating material to fill a gap region between the preliminary fin structures and then planarizing the insulating material, for example.

Figure 8:
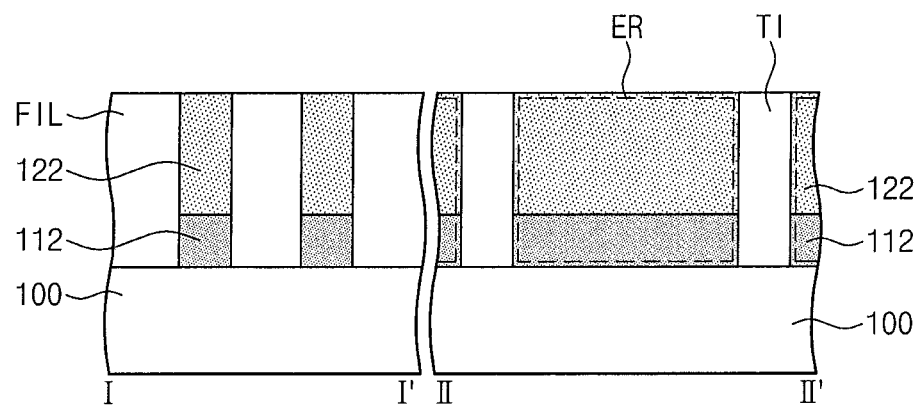

Referring to FIG. 8, the preliminary fin structures may be patterned to form a plurality of device regions ER, each of which includes the buffer pattern 112 and the active pattern 122 that are sequentially stacked on the semiconductor substrate 100. The device isolation pattern TI may be formed between each of a plurality of device regions ER. In other words, the buffer and active patterns 112 and 122 may be defined by the device isolation pattern TI and the fin-isolating layer FIL.

Figure 9:
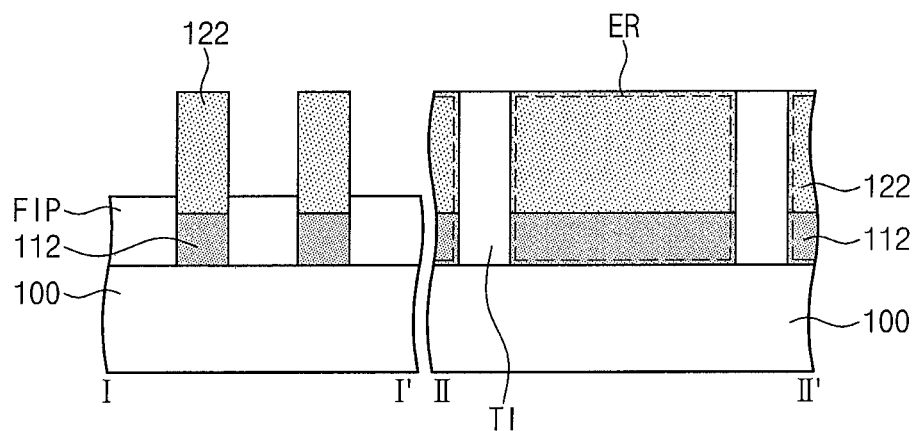

Referring to FIG. 9, the fin-isolating layer FIL may be vertically etched to form the fin-isolating pattern FIP. The fin-isolating pattern FIP may be formed in such a way that a top surface thereof is located below a top surface of the active pattern 122, and as a result, the active pattern 122 and the device isolation pattern TI may be partially exposed.

Figure 10:
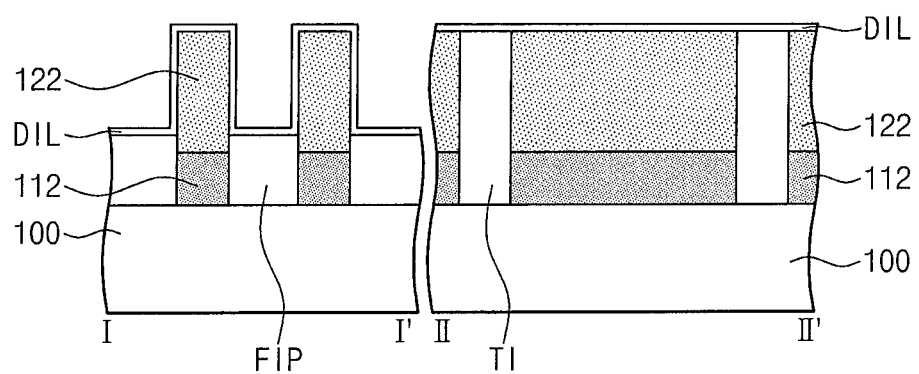
Figure 11:
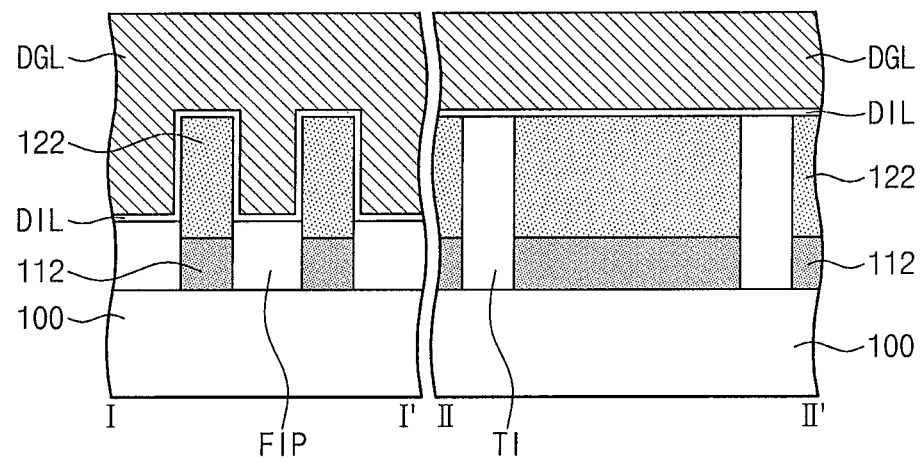
Figure 12:
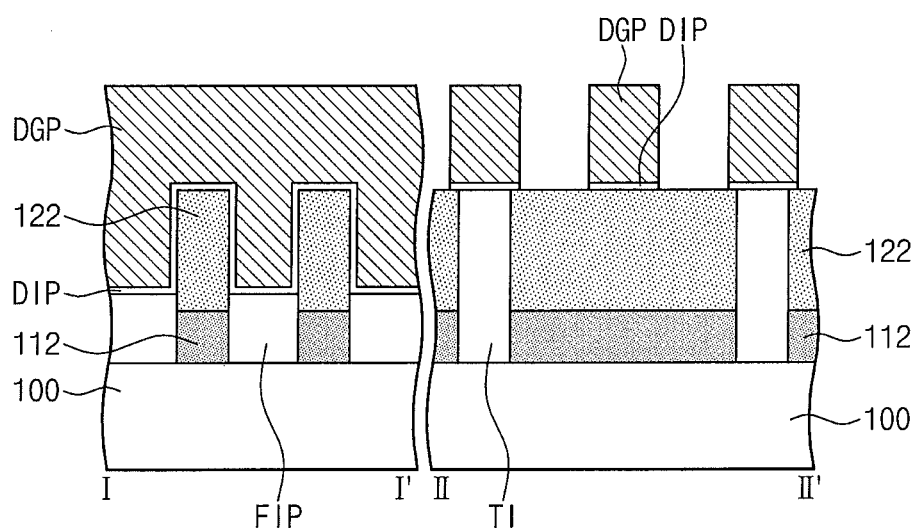

Referring to FIGS. 1, 4, and 10 through 12, a sacrificial insulating pattern DIP and a sacrificial gate pattern DGP may cross the active pattern 122 (in S120). The sacrificial insulating pattern DIP may partially cover top and side surfaces of the active pattern 122, and the sacrificial gate pattern DGP may be formed on the sacrificial insulating pattern DIP. In exemplary embodiments in accordance with principles of inventive concepts, the formation of the sacrificial insulating pattern DIP and the sacrificial gate pattern DGP may include forming a sacrificial insulating layer DIL as shown in FIG. 10, forming the sacrificial gate layer DGP as shown in FIG. 11, and patterning the sacrificial gate layer DGL and the sacrificial insulating layer DIL as shown in FIG. 12.

As shown in FIG. 10, the sacrificial insulating layer DIL may cover the exposed portion of the active pattern 122, the device isolation pattern TI, and the fin-isolating pattern FIP. The sacrificial insulating layer DIL may be formed of a silicon oxide layer, a silicon nitride layer, or a silicon oxynitride layer, for example.

As shown in FIG. 11, the sacrificial gate layer DGL may be formed on the sacrificial insulating layer DIL. The sacrificial gate layer DGL may fill a gap region between the active patterns 122 and may be formed of a material having an etch selectivity with respect to the device isolation pattern TI, the fin-isolating pattern FIP, and the active pattern 122. For example, the sacrificial gate layer DGL may be formed of a doped poly-silicon layer, an undoped poly-silicon layer, a silicon germanium layer, or a silicon carbide layer. Additionally, the sacrificial gate layer DGL may be formed using chemical vapor deposition (CVD), physical vapor deposition (PVD), or an atomic layer deposition (ALD) process, for example. After the formation of the sacrificial gate layer DGL, a planarization process may be performed on a top surface of the sacrificial gate layer DGL.

As shown in FIG. 12, the sacrificial gate layer DGL and the sacrificial insulating layer DIL may be patterned to form the sacrificial gate pattern DGP and the sacrificial insulating pattern DIP. The patterning of the sacrificial gate layer DGL may be performed to form the sacrificial gate pattern DGP crossing the active pattern 122, for example. The patterning of the sacrificial insulating layer DIL may be performed to etch portions of the sacrificial insulating layer DIL, which are not covered by the sacrificial gate pattern DGP, and thus, the sacrificial insulating pattern DIP may be locally formed under the sacrificial gate pattern DGP. Additionally, portions of the active pattern 122 that are positioned at both sides of the sacrificial gate pattern DGP may be exposed by the sacrificial insulating pattern DIP.

Figure 13:
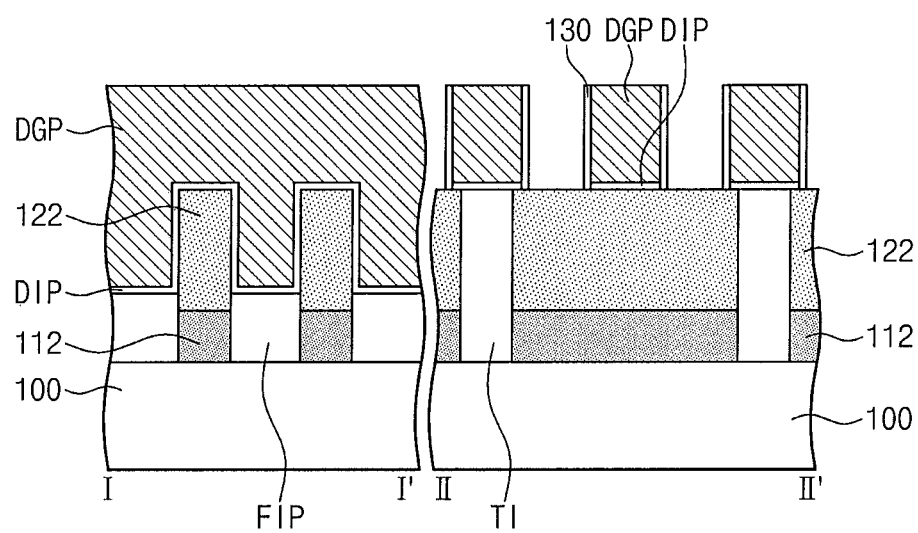

Referring to FIGS. 1, 4, and 13, the gate spacer 130 may be formed on sidewalls of the sacrificial gate pattern DGP (in S130). The formation of the gate spacer 130 may include conformally forming a gate spacer layer (not shown) on the resulting structure with the sacrificial gate pattern DGP and then anisotropically etching the gate spacer layer, for example.

Figure 14:
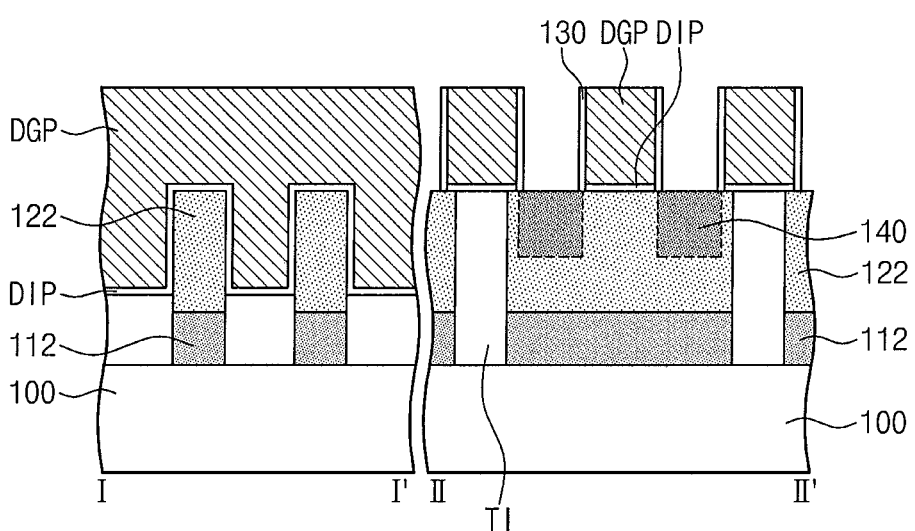

Referring to FIGS. 1, 4, and 14, the source and drain regions 140 may be formed in the portions of the active pattern 122 that are positioned at both sides of the sacrificial gate pattern DGP (in S140). The source and drain regions 140 may be formed by injecting impurities into the portions of the active pattern 122 exposed at both sides of the sacrificial gate pattern DGP using, for example, an ion implantation process. As an example, for an NMOS FET, the source and drain regions 140 may contain n-type impurities and, for a PMOS FET, the source and drain regions 140 may contain p-type impurities.

Figure 15:
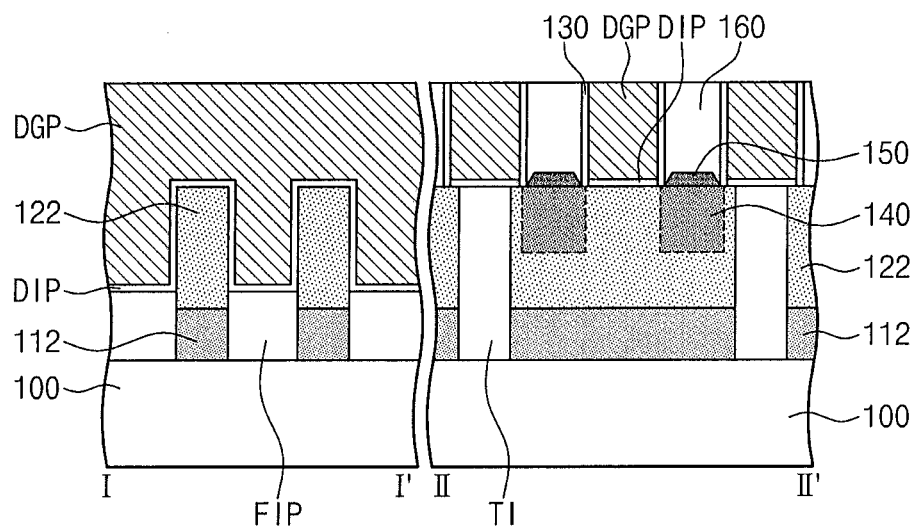

Referring to FIGS. 1, 4, and 15, the source and drain patterns 150 may be formed respectively on the source and drain regions 140 (in S150). In exemplary embodiments in accordance with principles of inventive concepts the source and drain patterns 150 may be formed by an epitaxial growth process. In exemplary embodiments in accordance with principles of inventive concepts, the epitaxial growth process may be performed in such a way that the source and drain patterns 150 are doped with impurities in an in-situ manner. As an example, for an NMOS FET, the source and drain patterns 150 may contain n-type impurities and for a PMOS FET, the source and drain patterns 150 may contain p-type impurities. The source and drain patterns 150 may have the same lattice structure as, but a different lattice constant from, the active pattern 122. As an example, in exemplary embodiments in which the FET is of an n-type, the source and drain patterns 150 may have a lattice constant smaller than that of the active pattern 122. For example, in the case where the active pattern 122 is formed of silicon (Si), the source and drain patterns 150 may be formed of silicon carbide ($Si_{1-x}C_x$). In such exemplary embodiments a compressive strain may be exerted on the source and drain regions 140 from the source and drain patterns 150, and as a result, a tensile strain may be exerted on the active pattern 122 between the source and drain regions 140. As another example, in embodiments in which the FET is of a p-type, the source and drain patterns 150 may have a lattice constant larger than that of the active pattern 122. For example, in exemplary embodiments in which the active pattern 122 is formed of silicon (Si), the source and drain patterns 150 may be formed of silicon germanium ($Si_{1-x}Ge_x$). In such exemplary embodiments a tensile strain may be exerted on the source and drain regions 140 from the source and drain patterns 150 and, as a result, a compressive strain may be exerted on the active pattern 122 between the source and drain regions 140.

Thereafter, the interlayered insulating layer 160 may cover the resulting structure with the source and drain patterns 150. The formation of the interlayered insulating layer 160 may include forming an insulating layer on the resulting structure with the source and drain patterns 150 and then etching the insulating layer to expose a top surface of the sacrificial gate pattern DGP, for example.

Figure 16:
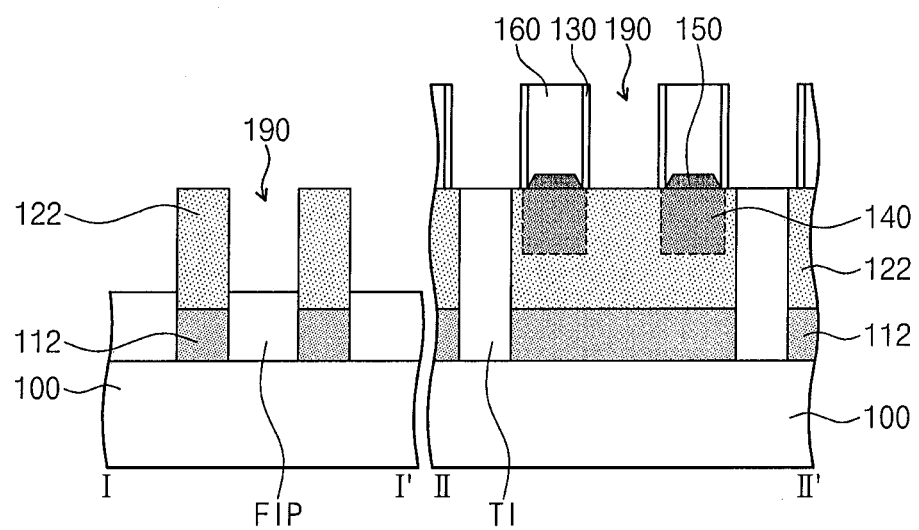

Referring to FIGS. 1, 4, and 16, the sacrificial insulating pattern DIP and the sacrificial gate pattern DGP may be removed (in S160). In exemplary embodiments in accordance with principles of inventive concepts, sacrificial insulating pattern DIP and the sacrificial gate pattern DGP may be removed by sequentially etching the sacrificial gate pattern DGP and the sacrificial insulating pattern DIP using, for example, an etch recipe having an etch selectivity with respect to the active pattern 122, the gate spacer 130, the interlayered insulating layer 160, and the fin-isolating pattern FIP. As a result of the removal of the sacrificial insulating pattern DIP and the sacrificial gate pattern DGP, a gap region 190 may partially expose top and side surfaces of the active pattern 122 between the gate spacer 130.

Figure 17:
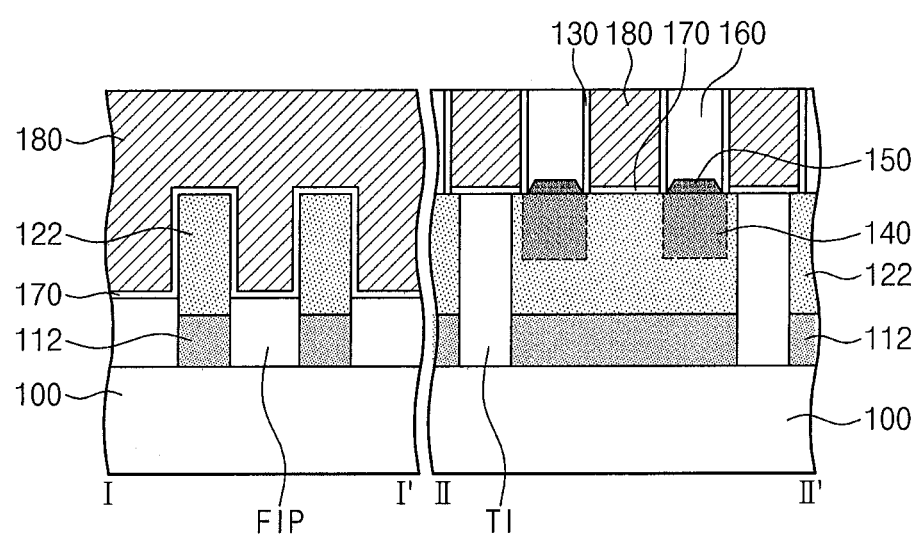

Referring to FIGS. 1, 4, and 17, the gate insulating layer 170 and the gate electrode 180 may fill the gap region 190 (in S170). In exemplary embodiments in accordance with principles of inventive concepts, the gate insulating layer 170 may be interposed between the active pattern 122 and the gate electrode 180. In exemplary embodiments in accordance with principles of inventive concepts gate insulating layer 170 may be formed by performing a thermal oxidation process on the active pattern 122 exposed by the gap region 190 or by depositing a high-k dielectric layer (e.g., of hafnium oxide, hafnium silicate, zirconium oxide, or zirconium silicate) in the gap region 190, for example. The gate electrode 180 may fill the gap region 190 in which the gate insulating layer 170 formed and may be extended to cross the active pattern 122. The gate electrode 180 may be thicker on the active pattern 122 than on the fin-isolating pattern FIP and may include a barrier metal layer and a metal layer. For example, the barrier metal layer may be formed of a metal nitride layer (e.g., of titanium nitride, tantalum nitride, tungsten nitride, hafnium nitride, and zirconium nitride). The metal layer may be formed of at least one of: tungsten, copper, hafnium, zirconium, titanium, tantalum, aluminum, ruthenium, palladium, platinum, cobalt, nickel, or conductive metal nitrides, for example.

Figure 18:
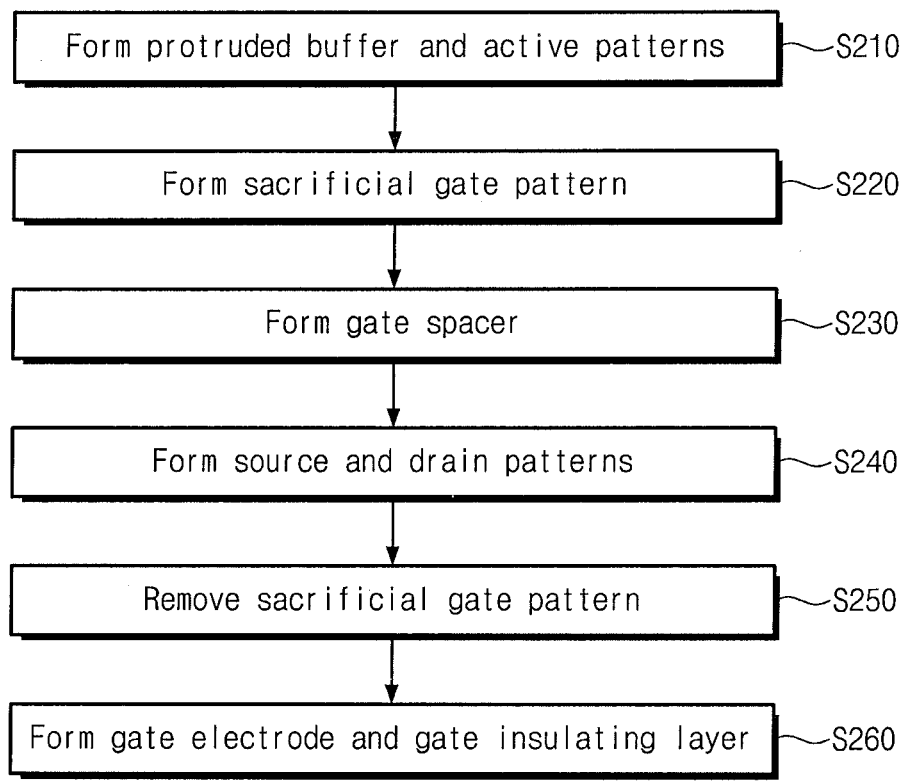
FIG. 18 is a flow chart illustrating a method of fabricating a field effect transistor according to a second exemplary embodiment in accordance with principles of inventive concepts.
Figure 19:
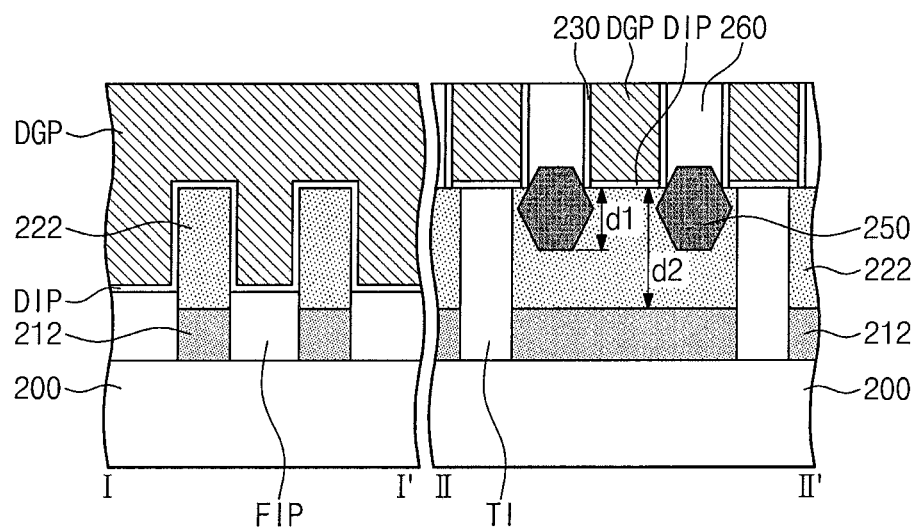
FIGS. 19 through 21 are sectional views illustrating a method of fabricating a field effect transistor according to a second exemplary embodiment in accordance with principles of inventive concepts.
Figure 20:
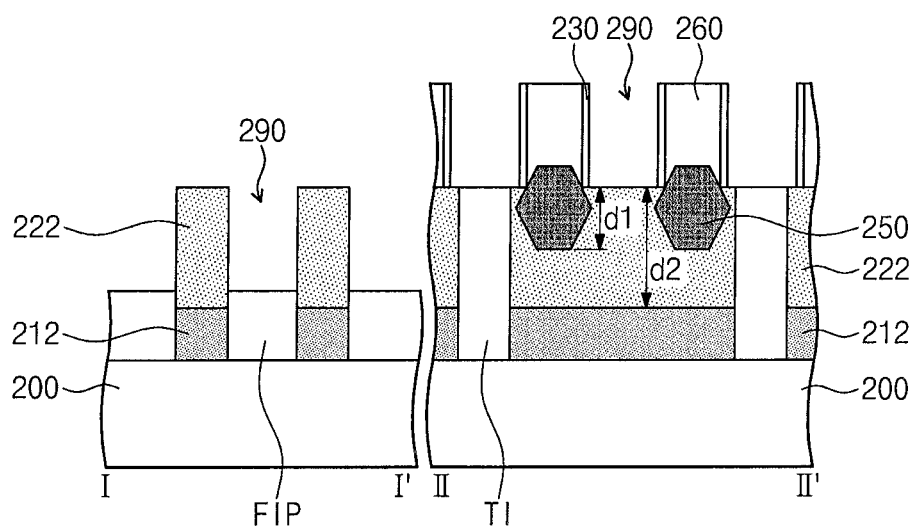
Figure 21:
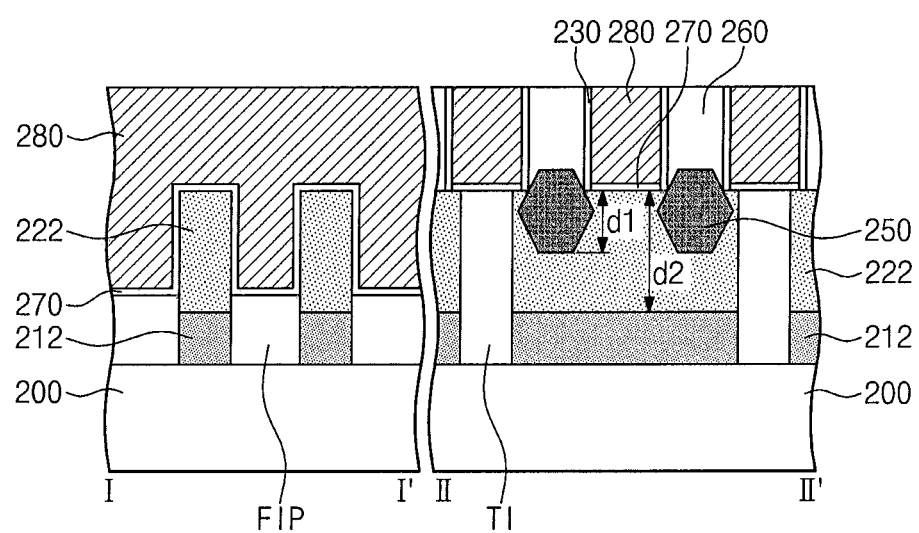

FIG. 18 is a flow chart illustrating a method of fabricating a field effect transistor according to a second exemplary embodiment in accordance with principles of inventive concepts. FIGS. 19 through 21 are sectional views illustrating a method of fabricating a field effect transistor according to a second exemplary embodiment in accordance with principles of inventive concepts. Each of FIGS. 19 through 21 shows sections taken along lines IT and II-II' of FIG. 1. Hereinafter, the method of fabricating a field effect transistor according to the second exemplary embodiment in accordance with principles of inventive concepts will be described with reference to FIGS. 1 and 18 through 21. For concise description, previously described elements may be identified by a similar or identical reference number and a detailed description thereof will not be repeated here.

Referring to FIG. 18, a method of fabricating a field effect transistor may include forming buffer and active patterns protruding from a semiconductor substrate (in S210), forming a sacrificial gate pattern (in S220), forming a gate spacer (in S230), forming source and drain patterns (in S240), removing a sacrificial gate pattern (in S250), and forming a gate electrode and a gate insulating layer (in S260).

The steps S210, S220, and S230 may be performed in the same manner as the steps S110, S120 and S130 of the fabrication method previously described with reference to FIGS. 4 through 17, and thus, a detailed description thereof will not be repeated here.

Referring to FIGS. 1, 18, and 19, the source and drain patterns 250 may be formed at both sides of the gate electrode 280. For example, the source and drain patterns 250 may be inserted into the active pattern 222 and may be vertically spaced apart from the buffer pattern 212. The formation of the source and drain patterns 250 may include performing a recessing process on the structure of FIG. 13 to recess portions of the active pattern 222 at both sides of the gate electrode 280, and then growing semiconductor patterns from the recessed portions using, for example, an epitaxial growth process. In exemplary embodiments, the epitaxial growth process may be performed in such a way that the source and drain patterns 150 are doped with impurities in an in-situ manner. As an example, in embodiments in which the FET is of an n-type, the source and drain patterns 250 may contain n-type impurities. As another example, in embodiments in which the FET is of a p-type, the source and drain patterns 250 may contain p-type impurities. The source and drain patterns 250 may have top surfaces that are higher than that of the active pattern 222. In exemplary embodiments, the source and drain patterns 250 may be formed in such a way that a thickness of a portion inserted into the active pattern 222 (hereinafter, a recess depth d1) ranges from about ⅓ to ⅔ times a thickness d2 of the active pattern 222. In other exemplary embodiments, the recess depth d1 may be about half the thickness d2 of the active pattern 222. The source and drain patterns 250 may have the same lattice structure as, but a lattice constant different from, the active pattern 222. As an example, in embodiments in which the FET is of an n-type, the source and drain patterns 250 may have a lattice constant smaller than that of the active pattern 222. In such embodiments, a tensile strain may be exerted on the active pattern 222. As another example, in embodiments in which the FET is of a p-type, the source and drain patterns 250 may have a lattice constant larger than that of the active pattern 222. In such embodiments, a compressive strain may be exerted on the active pattern 222.

Additionally, an interlayered insulating layer 260 may cover the resulting structure with the source and drain patterns 250. The formation of the interlayered insulating layer 260 may include forming an insulating layer on the resulting structure provided with the source and drain patterns 250, and then etching the insulating layer to expose a top surface of the sacrificial gate pattern DGP, for example.

Referring to FIGS. 1, 18, and 20, the sacrificial insulating pattern DIP and the sacrificial gate pattern DGP may be removed (in S250). In exemplary embodiments in accordance with principles of inventive concepts the sacrificial insulating pattern DIP and the sacrificial gate pattern DGP may be removed by sequentially etching the sacrificial gate pattern DGP and the sacrificial insulating pattern DIP using an etch recipe having an etch selectivity with respect to the active pattern 222, the gate spacer 230, the interlayered insulating layer 260, and the fin-isolating pattern FIP. As a result of the removal of the sacrificial insulating pattern DIP and the sacrificial gate pattern DGP, a gap region 290 may partially expose top and side surfaces of the active pattern 222, between the gate spacers 230.

Referring to FIGS. 1, 18, and 21, a gate insulating layer 270 and a gate electrode 280 may fill the gap region 290 (in S260). The gate insulating layer 270 may be interposed between the active region 222 and the gate electrode 280. The gate insulating layer 270 may cover the top and side surfaces of the active pattern 222 exposed by the gap region 290 and may be formed by depositing a high-k dielectric layer (e.g., of hafnium oxide, hafnium silicate, zirconium oxide, or zirconium silicate), for example. The gate electrode 280 may fill the remaining space of the gap region 290 with the gate insulating layer 270. The gate electrode 280 may include a barrier metal layer and a metal layer. For example, the barrier metal layer may be formed of a metal nitride layer (e.g., of titanium nitride, tantalum nitride, tungsten nitride, hafnium nitride, and zirconium nitride). The metal layer may be formed of at least one of tungsten, copper, hafnium, zirconium, titanium, tantalum, aluminum, ruthenium, palladium, platinum, cobalt, nickel, or conductive metal nitrides, for example.

Figure 22:
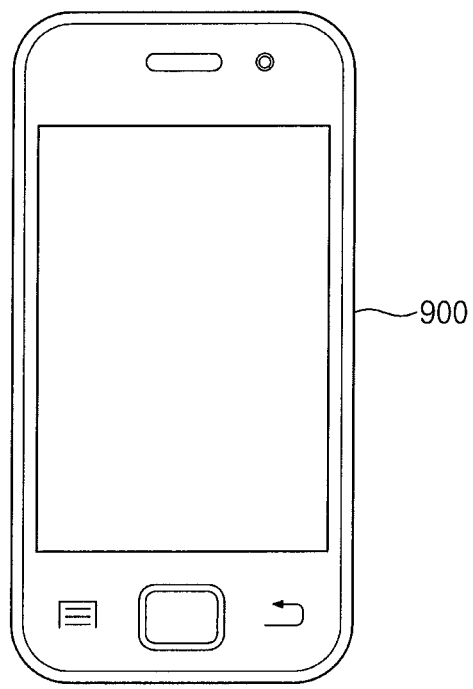
FIG. 22 is a diagram illustrating electronic devices including a field effect transistor according to exemplary embodiments in accordance with principles of inventive concepts.

FIG. 22 is a diagram illustrating an example embodiment of electronic devices including a field effect transistor in accordance with principles of inventive concepts.

As shown in FIG. 22, a field effect transistor in accordance with principles of inventive concepts may be used to implement a mobile phone 900, for example. Alternatively, a field effect transistor in accordance with principles of inventive concepts may be used to implement a smart phone, a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit information data wirelessly.

Figure 23:
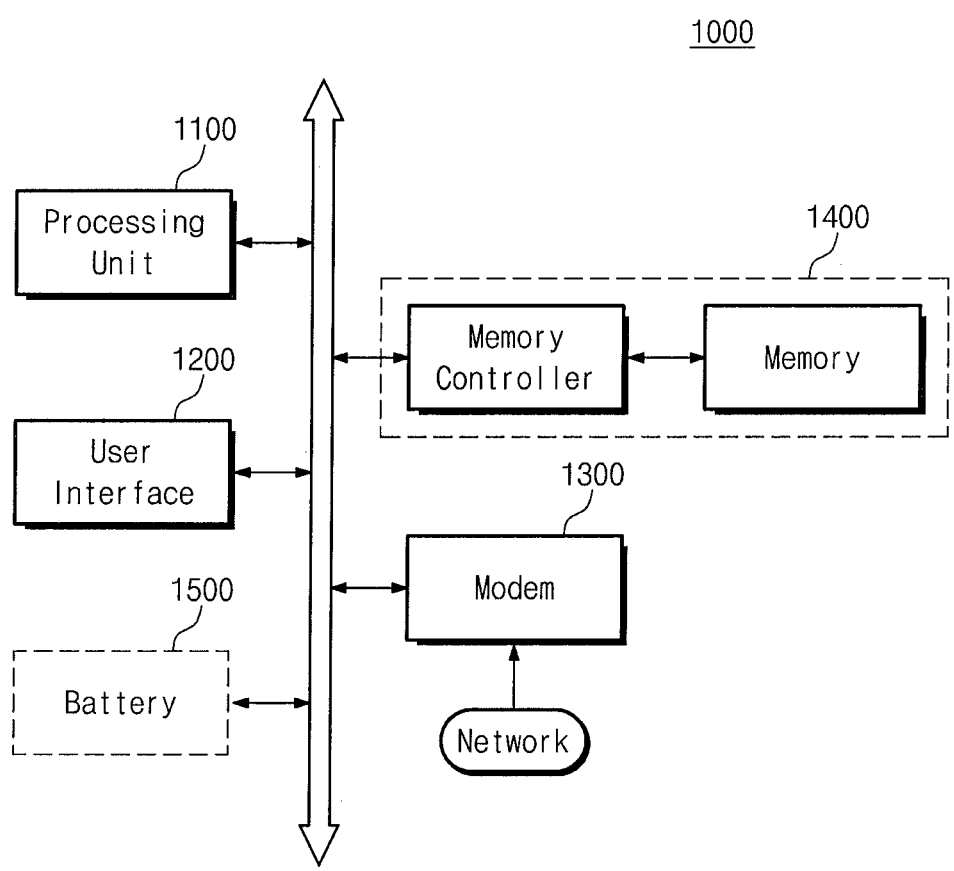
FIG. 23 is a block diagram illustrating electronic devices including a field effect transistor according to exemplary embodiments in accordance with principles of inventive concepts.

FIG. 23 is a block diagram illustrating an example of electronic devices including a field effect transistor in accordance with principles of inventive concepts.

Referring to FIG. 23, an electronic device 1000 in accordance with principles of inventive concepts may include a micro-processor 1100, a user interface 1200, a modem 1300 (e.g., a baseband chipset), and a semiconductor device 1400, any or all of which may be configured to include a field effect transistor in accordance with principles of inventive concepts.

In exemplary embodiments in which the electronic device 1000 is provided for a mobile application, the electronic device 1000 may further include a battery 1500. Additionally, although not shown, the electronic device 1000 may include other electronic components, such as an application chipset and a camera image processor (CIS), as will be apparent to persons skilled in the art.

In accordance with principles of inventive concepts, a MOSFET may be formed with a strain-inducing mismatch of lattice constants that improves carrier mobility. In exemplary embodiments a MOSFET includes a strain-inducing lattice constant mismatch that is not undermined by a recessing step. In some exemplary embodiments in accordance with principles of inventive concepts, a source/drain pattern is grown without a recessing step, thereby circumventing the deleterious effects of a recessing step. In other exemplary embodiments in accordance with principles of inventive concepts, a recessing process may be performed in a way that does not expose top surfaces of a strain-relaxed buffer layer. By avoiding exposure, due to a recessing step, of a device layer (for example, strain-relaxed buffer layer or a device isolation layer), a MOSFET, and method of forming the same, in accordance with principles of inventive concepts provides an electronic device with high mobility carriers in a reliable fashion.

While exemplary embodiments of inventive concepts have been particularly shown and described, it will be understood that variations in form and detail may be made therein without departing from the spirit and scope of inventive concepts.

What is claimed is:

1. A field effect transistor, comprising:
   a semiconductor substrate;
   an active pattern protruding from the semiconductor substrate;
   a buffer pattern interposed between the active pattern and the semiconductor substrate;
   a gate electrode crossing and partially covering top and side surfaces of the active pattern;
   a gate insulating layer interposed between the gate electrode and the active pattern; and
   source and drain patterns spaced apart from the buffer pattern, each of the source and drain patterns comprising an epitaxial layer and an insertion portion inserted into the active pattern at a corresponding one of both sides of the gate electrode,
   wherein the active pattern has a lattice constant different from that of the buffer pattern, so that the active pattern is strained by the buffer pattern, wherein the source and drain patterns have a lattice constant different from that of the active pattern,
   wherein the active pattern is in contact with the buffer pattern, and
   wherein the insertion portion of the source and drain patterns has a thickness ranging from about ⅓ to about ⅔ the thickness of the active pattern.

2. The field effect transistor of claim 1, wherein the source and drain patterns have top surfaces positioned at a higher level than a top surface of the active pattern.

3. The field effect transistor of claim 1, wherein the active pattern is of a p-type, the source and drain patterns are of an n-type, and the buffer pattern has a lattice constant larger than that of the active pattern.

4. The field effect transistor of claim 3, wherein the source and drain patterns have a lattice constant smaller than that of the active pattern.

5. The field effect transistor of claim 1, wherein the active pattern is of an n-type, the source and drain patterns are of a p-type, and the buffer pattern has a lattice constant smaller than that of the active pattern.

6. The field effect transistor of claim 5, wherein the source and drain patterns have a lattice constant larger than that of the active pattern.

7. The field effect transistor of claim 1, wherein the source and drain patterns have bottom surfaces positioned at a higher level than a lowermost surface of the gate electrode.

8. A field effect transistor, comprising:
   a semiconductor substrate;
   an active pattern protruding from the semiconductor substrate;
   a buffer pattern interposed between the active pattern and the semiconductor substrate, the active pattern and buffer layer having a strain-inducing mismatch in lattice constants;
   a gate electrode crossing and partially covering top and side surfaces of the active pattern;
   a gate insulating layer interposed between the gate electrode and the active pattern;
   source and drain regions formed in portions of the active pattern at both sides of the gate electrode and doped with impurities; and
   source and drain patterns provided on the source and drain regions, respectively, each of the source and drain patterns including an epitaxial layer, wherein bottom surfaces of the source and drain patterns are above a top surface of the buffer layer, wherein the active pattern is not recessed.

9. The field effect transistor of claim 8, wherein the strain is a compressive strain.

10. The field effect transistor of claim 8, wherein the strain is a tensile strain.

11. An electronic device including the field effect transistor of claim 8.

* * * * *